US012787613B2

(12) United States Patent
Choi et al.

(10) Patent No.: US 12,787,613 B2
(45) Date of Patent: Nov. 3, 2026

(54) LIGHT EMITTING DISPLAY DEVICE

(71) Applicant: LG Display Co., Ltd., Seoul (KR)

(72) Inventors: Kwanghyun Choi, Seoul (KR); ChangSoo Kim, Paju-si (KR); Cheolhwan Lee, Suwon-si (KR); SeYeoul Kwon, Goyang-si (KR); JeongOk Jo, Seoul (KR); SeongYeong Kim, Busan (KR)

(73) Assignee: LG Display Co., Ltd., Seoul (KR)

(*) Notice: Subject to any disclaimer, the term of this patent is extended or adjusted under 35 U.S.C. 154(b) by 515 days.

(21) Appl. No.: 18/470,738

(22) Filed: Sep. 20, 2023

(65) Prior Publication Data

US 2024/0224754 A1 Jul. 4, 2024

(30) Foreign Application Priority Data

Dec. 28, 2022 (KR) ........................ 10-2022-0186896

(51) Int. Cl.
*H10K 59/80* (2023.01)
*H10K 59/122* (2023.01)

(52) U.S. Cl.
CPC ......... *H10K 59/879* (2023.02); *H10K 59/122* (2023.02)

(58) Field of Classification Search
CPC ........................... H10K 59/879; H10K 59/122
See application file for complete search history.

(56) References Cited

U.S. PATENT DOCUMENTS

| | | | | |
|---|---|---|---|---|
| 11,114,467 | B2 * | 9/2021 | Kim ........................ | H10K 59/32 |
| 2011/0284881 | A1 | 11/2011 | Shikina et al. | |
| 2022/0052135 | A1 | 2/2022 | Heo et al. | |
| 2022/0199712 | A1 | 6/2022 | Park et al. | |
| 2022/0399529 | A1 | 12/2022 | Shin et al. | |
| 2023/0113068 | A1 * | 4/2023 | Garcia ............... | A63B 21/0728 482/106 |

FOREIGN PATENT DOCUMENTS

| | | | |
|---|---|---|---|
| EP | 4207972 | A1 | 7/2023 |
| JP | 2003168561 | A | 6/2003 |
| JP | 2005209542 | A | 8/2005 |
| JP | 2006113564 | A | 4/2006 |
| KR | 20220020166 | A | 2/2022 |
| KR | 20220091273 | A | 6/2022 |
| KR | 10-2022-0165958 | A | 12/2022 |

(Continued)

*Primary Examiner* — Joseph L Williams
(74) *Attorney, Agent, or Firm* — Seed Intellectual Property Law Group LLP

(57) ABSTRACT

A display device selectively operating between a wide field of view mode and a narrow field of view mode is disclosed. The device includes a substrate having thereon a first subpixel, a second subpixel, and a third subpixel of different color. The first subpixel has an area smaller than that of the second and third subpixels. Each of the first, second, and third subpixels include a first light emitting diode, a first lens disposed over the first light emitting diode, a second light emitting diode adjacent to the first light emitting diode, and a second lens disposed over the second light emitting diode. The narrow field of view mode is implemented based on the first lens and the wide field of view mode is implemented based on the second lens.

20 Claims, 9 Drawing Sheets

(56) References Cited

FOREIGN PATENT DOCUMENTS

| | | | |
|---|---|---|---|
| TW | I530930 | B | 4/2016 |
| TW | I597526 | B | 9/2017 |
| TW | I661547 | B | 6/2019 |
| TW | I726251 | B | 5/2021 |
| WO | WO 2011145174 | A1 | 11/2011 |

* cited by examiner

LIGHT EMITTING DISPLAY DEVICE

CROSS-REFERENCE TO RELATED APPLICATIONS

This application claims the priority of Korean Patent Application No. 10-2022-0186896 filed on Dec. 28, 2022, in the Korean Intellectual Property Office, the disclosure of which is incorporated herein by reference.

BACKGROUND

Technical Field

The present disclosure relates to a light emitting display device, and more particularly, to a light emitting display device which is capable of controlling a viewing angle.

Description of the Related Art

An organic light emitting diode (OLED) which is a self-emitting device includes an anode electrode, a cathode electrode, and an organic compound layer formed therebetween. The organic compound layer is formed of a hole transport layer (HTL), an emission layer (EML), and an electron transport layer (ETL). When a driving voltage is applied to the anode electrode and the cathode electrode, holes which pass through the hole transport layer HTL and electrons which pass through the electron transport layer ETL move to the emission layer EML to form excitons so that the emission layer EML generates visible rays. An active matrix type light emitting display device includes an organic light emitting diode (OLED) which is a self-emitting device, and is used in various ways with the advantages of a fast response speed, large emission efficiency, high luminance, and wide viewing angle.

The light emitting display device disposes pixels each including an organic light emitting diode in a matrix form and adjusts a luminance of the pixel in accordance with a gray scale level of video data.

BRIEF SUMMARY

Generally, an OLED display device has a wide viewing angle. However, recently, there is a need in the industry for adjusting the viewing angle (e.g., limiting the viewing angle at a certain direction or at a certain degree) for protection of privacy and protection of information reasons.

Further, when a light emitting display device for providing driving information for a vehicle is used, there is a problem in that images displayed by the light emitting device are reflected on a windshield of the vehicle to obstruct the driver's view. Reflection of images in vehicles is especially severe during the night driving, which hinders safe driving. Accordingly, it is beneficial to adjust or limit the viewing angle of the light emitting display device when it is applied to a vehicle so that the images displayed from the device are not reflected on the windshield of the vehicle and does not obstruct the driver's view.

In addition, adjusting or restricting the viewing angle varies depending on whether a vehicle is driven or whether a passenger or a driver is watching. Further, in some countries, a media played in the passenger's seat is prohibited from being exposed to the driver's seat. Therefore, it is beneficial if a viewing angle can be selectively switched.

One or more embodiments of the present disclosure address the various technical problems in the related art including the problems identified above.

For instance, one or more embodiments of the present disclosure provide a light emitting display device which may selectively restrict a viewing angle.

One or more embodiments of the present disclosure provide a light emitting display device which may suppress a black luminance increasing phenomenon caused by a difference in an emission area.

The technical benefits of the present disclosure are not limited to the above-mentioned benefits, and other benefits, which are not mentioned above, can be clearly understood by those skilled in the art from the following descriptions.

Other detailed matters of the exemplary embodiments are included in the detailed description and the drawings.

According to one or more embodiments of the present disclosure, a bank layer is open to be adjacent to an emission area of a sub pixel to increase the capacitance between the anode electrode and the cathode electrode, thereby suppressing the black luminance increasing phenomenon caused by a difference in an emission area.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
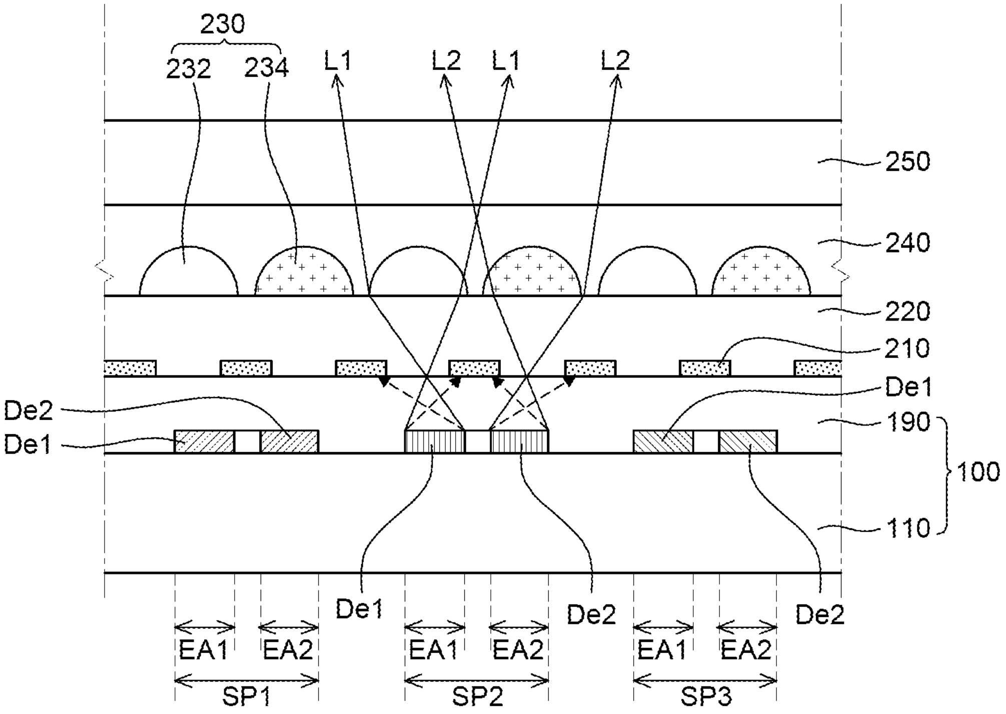
FIG. 1 is a schematic cross-sectional view of a light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the exemplary embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

Like reference numerals generally denote like elements throughout the specification. Further, in the following description of the present disclosure, a detailed explanation of known related technologies may be omitted to avoid unnecessarily obscuring the subject matter of the present disclosure. The terms such as "including." "having." and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a schematic cross-sectional view of a light emitting display device according to an exemplary embodiment of the present disclosure.

As illustrated in FIG. 1, a light emitting display device according to an exemplary embodiment of the present disclosure includes a display panel 100, a light shielding pattern 210, an optical gap layer 220, a lens layer 230, a planarization layer 240, and a polarization layer 250.

The display panel 100 includes a substrate 110, a plurality of first light emitting diodes De1, a plurality of second light emitting diodes De2, and an encapsulation layer 190.

First to third sub pixels SP1, SP2, and SP3 are defined on the substrate 110. For example, on the substrate 110, a first sub pixel SP1, a second sub pixel SP2, and a third sub pixel SP3 are defined. Each of the first to third sub pixels SP1, SP2, and SP3 has a first emission unit EA1 and a second emission unit EA2.

In the first emission unit EA1, a first light emitting diode De1 is provided and in a second emission unit EA2, a second light emitting diode De2 is provided. For instance, the first emission unit EA1 at least partially overlaps with the location where the first light emitting diode De1 is provided and the second emission unit EA2 at least partially overlaps with the location where the second light emitting diode De2 is provided. In some embodiments, the first emission unit EA1 may be referred to as the first emission area and the second emission unit EA2 may be referred to as the second emission area.

The first sub pixel SP1, the second sub pixel SP2, and the third sub pixels SP3 may be a red sub pixel, a green sub pixel, and a blue sub pixel, respectively. Accordingly, the first light emitting diode De1 and the second light emitting diode De2 of the first sub pixel SP1 emit red light, the first light emitting diode De1 and the second light emitting diode De2 of the second sub pixel SP2 emit green light. Further, the first light emitting diode De1 and the second light emitting diode De2 of the third sub pixel SP3 may emit blue light.

The encapsulation layer 190 with a flat top surface is provided above the first light emitting diode De1 and the second light emitting diode De2 to protect the first light emitting diode De1 and the second light emitting diode De2 from foreign external materials such as moisture and oxygen.

A specific configuration of the display panel 100 will be described in detail below.

The light shielding pattern 210 is provided above the display panel 100, specifically, above the encapsulation layer 190. The light shielding pattern 210 is formed between adjacent first to third sub pixels SP1, SP2, Sp3 or formed between the first emission unit EA1 and the second emission unit EA2.

Such a light shielding pattern 210 may be a black matrix and may be formed of black resin or chrome oxide. In contrast, the light shielding pattern 210 may be a touch electrode and may be formed of metal. At this time, a touch electrode includes a plurality of transmission electrodes and a plurality of reception electrodes intersecting each other, and a touch may be sensed from a variation of a capacitance between the plurality of transmission electrodes and the plurality of reception electrodes.

The optical gap layer 220 is provided above the light shielding pattern 210. The optical cap layer 220 secures an optical gap between the first light emitting diode De1 and the second light emitting diode De2 and lenses 232 and 234 of the lens layer 230. The optical cap layer 220 refracts light from the first light emitting diode De1 and the second light emitting diode De2 by the lenses 232 and 234 to a specific direction to improve the efficiency of the lenses 232 and 234. The optical gap layer 220 may have a thickness of several to several tens of μm, and may be formed of an organic insulating material.

For example, the optical gap layer 220 may be formed of photo acryl, benzocyclobutene (BCB), polyimide (PI), or polyamide (PA), but is not limited thereto.

The lens layer 230 is provided above the optical gap layer 220. The lens layer 230 includes a first lens 232 and a second lens 234. The first lens 232 is disposed in the first emission unit EA1 to refract light from the first light emitting diode De1 to a specific direction. The second lens 234 is disposed in the second emission unit EA2 to refract light from the second light emitting diode De2 to a specific direction. A part of each of the first lens 232 and the second lens 234 may overlap the light shielding pattern 210.

The first lens 232 is a half-spherical lens and the second lens 234 is a half-cylindrical lens. Therefore, first light L1 emitted from the first light emitting diode De1 of each sub pixel SP1. SP2, and SP3 is refracted at a specific angle by the first lens 232 to be output. Second light L2 emitted from the second light emitting diode De2 of each sub pixel SP1. SP2, and SP3 is refracted at a specific angle by the second lens 234 to be output. Accordingly, the viewing angle of each of the sub pixels SP1, SP2, and SP3 may be limited.

The planarization layer 240 is provided above the lens layer 230 to protect the first lens 232 and the second lens 234. The planarization layer 240 is formed of an organic insulating material and has a flat top surface. A refractive index of the planarization layer 240 is smaller than refractive indexes of the first lens 232 and the second lens 234.

For example, the planarization layer 240 may be formed of photo acryl, benzocyclobutene (BCB), polyimide (PI), or polyamide (PA), but is not limited thereto.

The polarization layer 250 is provided above the planarization layer 240. The planarization layer 250 may include a linear polarization layer and a retardation layer and serve to convert a polarized state of external light which is incident onto the display panel 100 to suppress the external light from being reflected from the display panel 100 and then discharged to the outside.

A display panel of a light emitting display device according to the exemplary embodiment of the present disclosure will be described with reference to FIG. 2.

Figure 2:
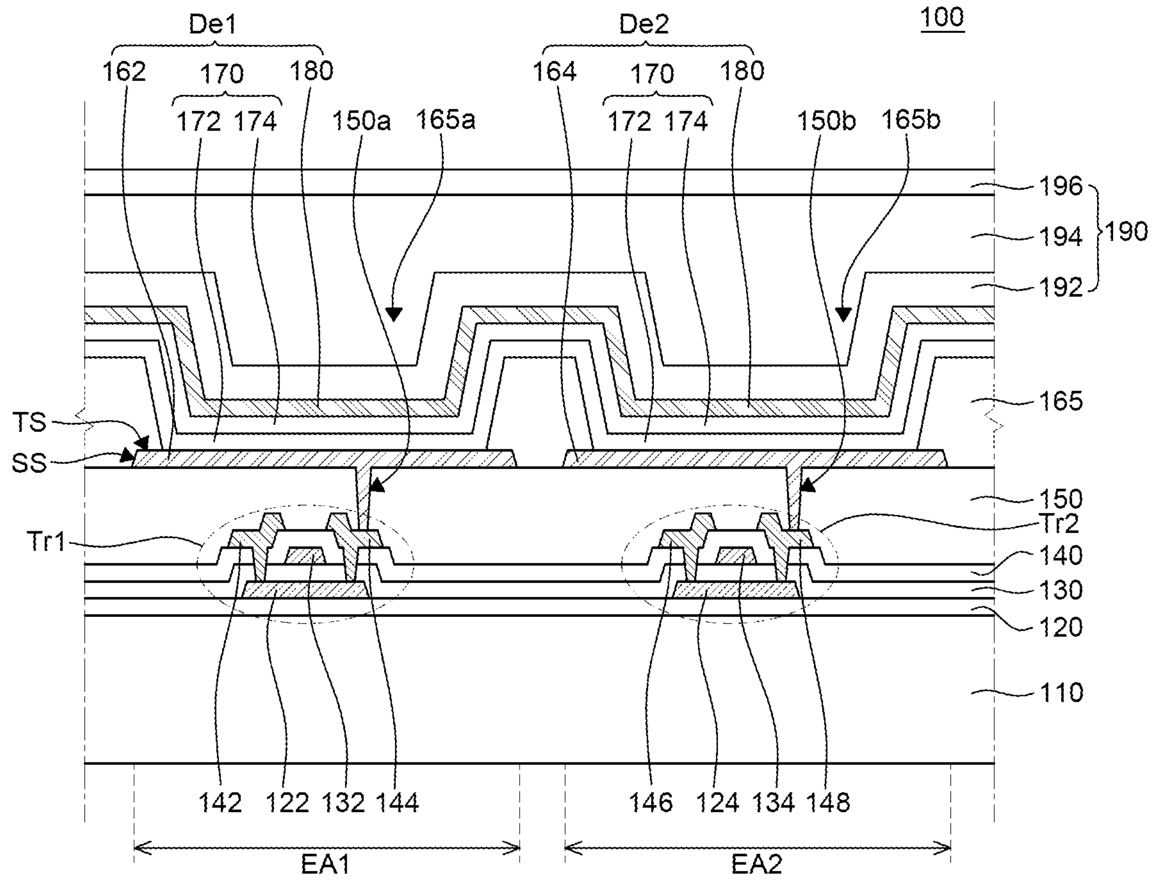
FIG. 2 is a schematic cross-sectional view of a display panel of a light emitting display device according to an exemplary embodiment of the present disclosure.

FIG. 2 is a schematic cross-sectional view of a display panel of a light emitting display device according to an exemplary embodiment of the present disclosure.

As illustrated in FIG. 2, a display panel 100 of a light emitting display device according to the exemplary embodiment of the present disclosure includes a substrate 110, a plurality of thin film transistors Tr1 and Tr2, a plurality of light emitting diodes De1 and De2, and an encapsulation layer 190.

Specifically, each sub pixel SP1, SP2, and SP3 on the substrate 110 includes a first emission unit EA1 and a second emission unit EA2. The substrate 110 may be a glass substrate or a plastic substrate. For example, as the plastic substrate, polyimide (PI) may be used, but is not limited thereto.

A buffer layer 120 is formed above the substrate 110. The buffer layer 120 is substantially located on the entire surface of the substrate 110. The buffer layer 120 blocks the moisture or foreign materials from being introduced into the thin film transistors Tr1 and Tr2 from the substrate 110. The buffer layer 120 may be formed of an inorganic material, such as silicon oxide ($SiO_2$) or silicon nitride (SiNx), and may be formed of a single layer or a plurality of layers.

A first semiconductor layer 122 and a second semiconductor layer 124 which are patterned are formed in the first emission unit EA1 and the second emission unit EA2 above the buffer layer 120, respectively. The first semiconductor layer 122 and the second semiconductor layer 124 may be independently formed of an oxide semiconductor material or polycrystalline silicon.

When the first semiconductor layer 122 and the second semiconductor layer 124 are formed of an oxide semiconductor material, a shield pattern may be further formed therebelow. The shield pattern blocks light incident onto the first semiconductor layer 122 and the second semiconductor layer 124 to suppress the degradation of the first semiconductor layer 122 and the second semiconductor layer 124 due to the light.

In contrast, when the first semiconductor layer 122 and the second semiconductor layer 124 are formed of polycrystalline silicon, impurities may be doped on both edges of each of the first semiconductor layer 122 and the second semiconductor layer 124.

A gate insulating layer 130 which is formed of an insulating material is formed above the first semiconductor layer 122 and the second semiconductor layer 124. In the meantime, according to the exemplary embodiment of the present disclosure, even though, in FIG. 2, it is illustrated that the gate insulating layer 130 is substantially formed on the entire surface of the substrate 110, as another example, the gate insulating layer 130 may be patterned with the same shape as the first gate electrode 132 and the second gate electrode 134.

The gate insulating layer 130 may be formed of an inorganic insulating material such as silicon oxide ($SiO_2$) or silicon nitride (SiNx). When the first semiconductor layer 122 and the second semiconductor layer 124 are formed of an oxide semiconductor material, the gate insulating layer 130 may be formed of silicon oxide ($SiO_2$). In contrast, when the first semiconductor layer 122 and the second semiconductor layer 124 are formed of polycrystalline silicon, the gate insulating layer 130 may be formed of silicon oxide ($SiO_2$) or silicon nitride (SiNx).

A first gate electrode 132 and a second gate electrode 134 which are formed of a conductive material, such as metal, are formed above the gate insulating layer 130 so as to correspond to the first semiconductor layer 122 and the second semiconductor layer 124, respectively. Further, a gate line (not illustrated) may be formed above the gate insulating layer 130. The gate line may extend along one direction.

An interlayer insulating layer 140 which is formed of an insulating material is substantially formed on the entire surface of the substrate 110, above the first gate electrode 132 and the second gate electrode 134. The interlayer insulating layer 140 may be formed of an inorganic insulating material such as silicon oxide ($SiO_2$) or silicon nitride (SiNx) or an organic insulating material such as photo acryl or benzocyclobutene.

The interlayer insulating layer 140 has a contact hole which exposes both top surfaces of the first semiconductor layer 122 and the second semiconductor layer 124. The contact hole may be also formed in the gate insulating layer 130. A first source electrode 142 and a first drain electrode 144 and a second source electrode 146 and a second drain electrode 148 are formed of a conductive material, such as metal, in the first emission unit EA1 and the second emission unit EA2 above the interlayer insulating layer 140. Further, a data line (not illustrated) and a power line (not illustrated) which extend along a direction perpendicular to one direction may be formed above the interlayer insulating layer 140.

The first source electrode 142 and the first drain electrode 144 are in contact with both sides of the first semiconductor layer 122 through the contact hole of the interlayer insulating layer 140. The second source electrode 146 and the second drain electrode 148 are in contact with both sides of the second semiconductor layer 124 through the contact hole of the interlayer insulating layer 140. Even though it is not illustrated, the data line extends along a direction perpendicular to one direction and intersects the gate line to define a pixel area corresponding to each sub pixel and a power line which supplies a high potential voltage is located to be spaced apart from the data line.

In the meantime, the first semiconductor layer 122, the first gate electrode 132, the first source electrode 142, and the first drain electrode 144 form the first thin film transistor Tr1. The second semiconductor layer 124, the second gate electrode 134, the second source electrode 146, and the second drain electrode 148 form the second thin film transistor Tr2.

One or more thin film transistors having the same structure as the first thin film transistor Tr1 and the second thin film transistor Tr2 may be further formed on the substrate 110 of each sub pixel, but are not limited thereto.

A passivation layer 150 is substantially formed with insulating material on the entire surface of the substrate 110, above the first source electrode 142, the first drain electrode 144, the second source electrode 146, and the second drain electrode 148. The passivation layer 150 may be formed of an organic insulating material, such as photo acryl, benzocyclobutene. Such a passivation layer 150 has a flat top surface.

In the meantime, an insulating layer which is formed of an inorganic insulating material, such as silicon oxide ($SiO_2$) or silicon nitride (SiNx), may be further formed below the passivation layer 150, that is, between the first thin film transistor Tr1 and the second thin film transistor Tr2 and the passivation layer 150.

The passivation layer 150 has a first drain contact hole 150*a* and a second drain contact hole 150*b* which expose the first drain electrode 144 and the second drain electrode 148, respectively.

A first anode electrode 162 and a second anode electrode 164 are formed above the passivation layer 150 with a conductive material having a relatively high work function. The first anode electrode 162 is located in the first emission unit EA1 and contacts with the first drain electrode 144 through the first drain contact hole 150*a*. The second anode electrode 164 is located in the second emission unit EA2 and contacts with the second drain electrode 148 through the second drain contact hole 150*b*.

For example, each of the first anode electrode 162 and the second anode electrode 164 may be formed of a transparent conductive material, such as indium tin oxide (ITO) or indium zinc oxide (IZO), but is not limited thereto.

In the meantime, the display panel 100 according to the exemplary embodiment of the present disclosure may be a top emission type in which light of the plurality of light emitting diodes De1 and De2 is output to an opposite direction to the substrate 110. Accordingly, each of the first anode electrode 162 and the second anode electrode 164 may further include a reflective electrode or a reflective layer which is formed of a metal material having a high reflectance below the transparent conductive material. For example, the reflective electrode or the reflective layer may be formed of an aluminum-palladium-copper (APC) alloy, silver (Ag), or aluminum (Al). At this time, each of the first anode electrode 162 and the second anode electrode 164 has a triple-layered structure of ITO/APC/ITO, ITO/Ag/ITO or ITO/Al/ITO, but is not limited thereto.

A bank layer 165 is formed of an insulating material above the first anode electrode 162 and the second anode electrode 164. For example, the bank layer 165 may be formed of a polyimide resin, an acrylic resin, or a benzocyclobutene resin, but is not limited thereto. In FIG. 2 of the present disclosure, the bank layer 165 has a single layered structure. However, in other embodiments, the bank layer 165 may also have a double layered structure. That is, the bank layer 165 may have a double layered structure including a lower hydrophilic bank layer and an upper hydrophobic bank layer.

The bank layer 165 overlaps edges of the first anode electrode 162 and the second anode electrode 164, and covers the edges of the first anode electrode 162 and the second anode electrode 164. For instance, the first anode electrode 162 has a side surface SS and a top surface TS and the bank layer 165 covers both the side surface SS and the top surface TS of the first anode electrode 162 at the edge. The bank layer 165 has a first opening 165*a* and a second opening 165*b* which expose the first anode electrode 162 and the second anode electrode 164. For example, the first opening 165*a* of the bank layer 165 exposes a portion of the top surface TS of the first anode electrode 162. The first opening 165*a* is then subsequently deposited with layers 172, 174, 180, and 192 which covers the first opening 165*a* of the bank layer 165. Similarly, the second opening 165*b* of the bank layer 165 exposes a portion of the top surface of the second anode electrode 164. The second opening 165*b* is then subsequently deposited with layers 172, 174, 180, and 192 which covers the second opening 165*b* of the bank layer 165.

The bank layer 165 included in at least one of the first sub pixel SP1, the second sub pixel SP2, and the third sub pixel SP3 may further include a third opening which additionally exposes at least one of the first anode electrode 162 and the second anode electrode 164. The bank layer including the third opening will be described in more detail below.

Next, the emission unit 170 is formed above the first anode electrode 162 and the second anode electrode 164 which are exposed through the first opening 165*a* and the second opening 165*b* of the bank layer 165. The emission unit 170 may include an organic material layer 172 and an emission layer 174 disposed between the first anode electrode 162 and the second anode electrode 164.

The organic material layer 172 is a functional layer disposed to improve a luminous efficiency of the emission layer 174. For example, the organic material layer 172 may include at least one of a hole injection layer (HIL) which facilitate the injection of holes, a hole transport layer (HTL) which facilitates the transport of the holes, an electron injection layer (EIL) which facilitates injection of electrons from the cathode electrode 180, and an electron transport layer (ETL) which facilitates the transport of the electrons. The organic material layer 172 may be formed as one layer in each sub pixel SP1, SP2, and SP3. Further, the organic material layer 172 may be formed as one layer over each sub pixel SP1, SP2, and SP3. That is, the organic material layers 172 of the sub pixel SP1, SP2, and SP3 are connected to each other to be integrated as a common layer. Even though in FIG. 2, it is illustrated that the organic material layer 172 is disposed below the emission layer 174, the organic material layer may be disposed above the emission layer 174 depending on the type of the organic material layer 172. For example, the hole injection layer (HIL) and the hole transport layer (HTL) are disposed below the emission layer 174, and the electron injection layer (EIT) and the electron transport layer (ETL) may be disposed above the emission layer 174.

The emission layer 174 may be formed by any one of red, green, and blue light emitting materials, but is not limited thereto. However, the light emitting material may be an organic light emitting material such as a phosphorescent compound or a fluorescent compound. However, the present disclosure is not limited thereto and an inorganic light emitting material, such as a quantum dot may also be used.

The emission layer 174 above the first anode electrode 162 and the emission layer 174 above the second anode electrode 164 are continuously connected and integrally formed. However, the present disclosure is not limited thereto, and the emission layer 174 above the first anode electrode 162 and the emission layer 174 above the second anode electrode 164 may be separated from each other.

The emission layer 174 may be formed by an evaporation process. At this time, in order to pattern the emission layer 174 for every sub pixel, a fine metal mask (FMM) may be used. In contrast, the emission layer 174 may be formed by a solution process and in this case, the emission layer 174 may be provided only in the first opening 165*a* and the second opening 165*b*. In the vicinity of the bank layer 165, as the emission layer 174 is closer to the bank layer 165, the height thereof may be increased.

The cathode electrode 180 which is formed of a conductive material having a relatively low work function may be formed on the entire surface of the substrate, above the emission unit 170. Here, the cathode electrode 180 may be formed of aluminum or magnesium, silver, or an alloy thereof. At this time, the cathode electrode 180 may have a relatively small thickness so that the light from the emission unit 170 may be transmissible therethrough. Further, the cathode electrode 180 may be formed of a transparent conductive material, such as indium gallium oxide (IGO), but is not limited thereto.

The first anode electrode 162, the emission unit 170, and the cathode electrode 180 of the first emission unit EA1 form the first light emitting diode De1, and the second anode electrode 164, the emission unit 170, and the cathode electrode 180 of the second emission unit EA2 form the second light emitting diode De2.

The display panel 100 according to the exemplary embodiment of the present disclosure may be a top emission type in which light from the emission units 170 of the first light emitting diode De1 and the second light emitting diode De2 is output to the opposite direction to the substrate 110, that is, to the outside through the cathode electrode 180. According to the top emission type, an emission area is larger than that of the bottom emission type with the same area so that the luminance is improved and the power consumption may be lowered.

An encapsulation layer 190 is formed on the substantially entire surface of the substrate 110, above the cathode electrode 180. The encapsulation layer 190 suppresses the hydrogen or oxygen from being introduced from the outside into the first light emitting diode De1 and the second light emitting diode De2. The encapsulation layer 190 may be formed as a single layer or a plurality of layers. For example, the encapsulation layer 190 may have a laminated structure of a first inorganic layer 192, an organic layer 194, and a second inorganic layer 196. Here, the organic layer 194 may be a film which covers a foreign material which is generated during the manufacturing process.

As described above, in the light emitting display device according to the exemplary embodiment of the present disclosure, each sub pixel SP1, SP2, and SP3 has a first emission unit EA1 and a second emission unit EA2. Further, a half spherical first lens 232 is provided above the first emission unit EA1 and a half cylindrical second lens 234 is provided above the second emission unit EA2 to limit the viewing angle.

Hereinafter, a pixel structure of a light emitting display device according to an exemplary embodiment of the present disclosure will be described with reference to FIG. 3.

Figure 3:
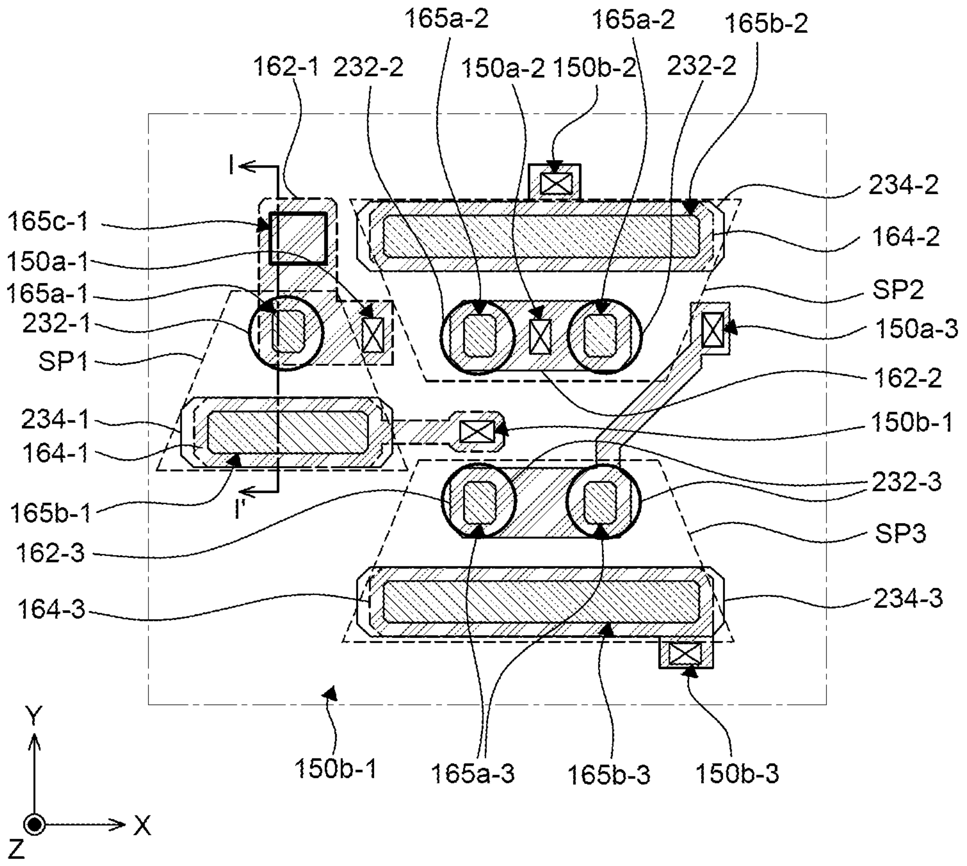
FIG. 3 is a plan view illustrating a pixel of a light emitting display device according to an exemplary embodiment of the present disclosure.

FIG. 3 is a plan view illustrating a pixel of a light emitting display device according to an exemplary embodiment of the present disclosure.

In FIG. 3, from each first to third sub pixels SP1, SP2, and SP3 of a pixel of the light emitting display device, a plurality of anode electrodes 162-1, 164-1, 162-2, 164-2, 162-3, and 164-3, a plurality of openings 165*a*-1, 165*b*-1, 165*c*-1, 165*a*-2, 165*b*-2, 165*a*-3, and 165*b*-3, and a plurality of lenses 232-1, 234-1, 232-2, 234-2, 232-3, and 234-3 are illustrated.

As illustrated in FIG. 3, the pixel of the light emitting display device according to the exemplary embodiment of the present disclosure includes first to third sub pixels SP1, SP2, and SP3. The first sub pixel SP1 may be a red sub pixel, the second sub pixel SP2 may be a green sub pixel, and the third sub pixel SP3 may be a blue sub pixel.

Here, the first sub pixel SP1 and the third sub pixel SP3 are disposed along the Y-axis direction, and the second sub pixel SP2 is disposed along the X-direction with respect to the first sub pixel SP1 and the third sub pixel SP3.

Each of the first to third sub pixels SP1, SP2, and SP3 may have a polygonal shape. At this time, the first to third sub pixels SP1, SP2, and SP3 may have different shapes. However, the present disclosure is not limited thereto and the first to third sub pixels SP1, SP2, and SP3 may have various shapes.

The first to third sub pixels SP1, SP2, and SP3 may have different areas. The areas of the first to third sub pixels SP1, SP2, and SP3 may be determined in consideration of a lifespan and a luminous efficiency of the light emitting diode provided in each sub pixel. At this time, a lifespan of the red light emitting diode is the longest. Accordingly, in order to make constant lifespan, an area of the first sub pixel SP1 is smaller than each area of the second sub pixel SP2 and the third sub pixel SP3. However, the present disclosure is not limited thereto and a ratio of areas of the first to third sub pixels SP1. SP2, and SP3 may vary. In the meantime, in the present disclosure, an area of the sub pixel may refer to an emission area of each sub pixel. The emission area may be defined as an opening formed on the bank layer in each sub pixel. For example, an emission area of the first sub pixel SP1 may be areas of the first opening 165*a*-1 and the second opening 165*b*-1 which define emission areas of the first light emitting diode De1 and the second light emitting diode De2 in the first sub pixel SP1. That is, as shown in FIG. 2, the location of the first light emitting diode De1 overlaps with the location of the first opening 165*a* and the location of the second light emitting diode De2 overlaps with the location of the second opening 165*b*.

As illustrated in FIGS. 1 to 3, the first sub pixel SP1 includes a first anode electrode 162-1 provided in the first emission unit EA1 and a second anode electrode 164-1 provided in the second emission unit EA2. The first anode electrode 162-1 provided in the first sub pixel SP1 connects to the first thin film transistor Tr1 through a first drain contact hole 150*a*-1. The second anode electrode 164-1 provided in the first sub pixel SP1 connects to the second thin film transistor Tr2 through a second drain contact hole 150*b*-1.

The second sub pixel SP2 also includes a first anode electrode 162-2 provided in the first emission unit EA1 and a second anode electrode 164-2 provided in the second emission unit EA2. The first anode electrode 162-2 provided in the second sub pixel SP2 connects to the first thin film transistor Tr1 through a first drain contact hole 150*a*-2. The second anode electrode 164-2 provided in the second sub pixel SP2 connects to the second thin film transistor Tr2 through a second drain contact hole 150*b*-2.

The third sub pixel SP3 also includes a first anode electrode 162-3 provided in the first emission unit EA1 and a second anode electrode 164-3 provided in the second emission unit EA2. The first anode electrode 162-3 provided in the third sub pixel SP3 connects to the first thin film transistor Tr1 through a first drain contact hole 150*a*-3. The third anode electrode 164-3 provided in the third sub pixel SP3 connects to the second thin film transistor Tr2 through a second drain contact hole 150*b*-3.

In each of the first to third sub pixels SP1, SP2, and SP3, at least one first opening from 165*a*-1, 165*a*-2, and 165*a*-3 is provided on the first anode electrodes 162-1, 162-2, and 162-3. In each of the first to third sub pixels SP1, SP2, and SP3, at least one second opening from 165*b*-1, 165*b*-2, and 165*b*-3 is provided on the second anode electrodes 164-1, 164-2, and 164-3. With respect to the X-Y plan view, each of the first openings 165*a*-1, 165*a*-2, and 165*a*-3 may have a shape in which a length in the X-direction is substantially the same as a length in the Y-direction. The second openings 165*b*-1, 165*b*-2, and 165*b*-3 have a polygonal a shape in which a length in the X-direction is longer than a length in the Y-direction. The area of each of the second openings 165*b*-1, 165*b*-2, 165*b*-3 may be larger than an area of at least one first opening from 165*a*-1, 165*a*-2, 165*a*-3.

Specifically, in the first sub pixel SP1, one first opening 165*a*-1 may be disposed on the first anode electrode 162-1, and one second opening 165*b*-1 may be disposed on the second anode electrode 164-1. The above-described one first opening 165*a*-1 and one second opening 165*b*-1 may be disposed in the Y-direction to be spaced apart from each other.

In the second sub pixel SP2, two first openings 165*a*-2 disposed in the X-direction may be disposed on the first anode electrode 162-2, and one second opening 165*b*-2 may be disposed on the second anode electrode 164-2. The above-described two first openings 165*a*-2 and one second opening 165*b*-2 may be disposed in the Y-direction to be spaced apart from each other.

In the third sub pixel SP3, two first openings 165*a*-3 disposed in the X-direction may be disposed on the first anode electrode 162-3, and one second opening 165*b*-3 may be disposed on the second anode electrode 164-3. The above-described two first openings 165*a*-3 and one second opening 165*b*-3 may be disposed in the Y-direction to be spaced apart from each other.

Half-spherical first lenses 232-1, 232-2, and 232-3 are disposed so as to correspond to each of the first openings 165*a*-1, 165*a*-2, and 165*a*-3, and half-cylindrical second lenses 234-1, 234-2, and 234-3 are disposed so as to correspond to the second openings 165*b*-1, 165*b*-2, and 165*b*-3. That is, referring to FIGS. 1 and 2, the half-spherical first lens 232 is disposed to overlap with the first opening 165*a* and the half-cylindrical second lens 234 is disposed to overlap with the second opening 165*b*. Further, as described above, the first emission unit EA1 overlaps with the first opening 165*a* and the second emission unit EA2 overlaps with the second opening 165*b*. Accordingly, the first emission unit EA1 also overlaps with the half-spherical first lens 232 and the second emission unit EA2 overlaps with the half-cylindrical second lens 234 as shown in FIG. 1.

Each of the first lenses 232-1, 232-2, and 232-3 is disposed so as to cover each of the first openings 165*a*-1, 165*a*-2, and 165*a*-3. With respect to the X-Y plane, an area of each of the first lenses 232-1, 232-2, and 232-3 may be larger than an area of each of the first openings 165*a*-1, 165*a*-2, and 165*a*-3. Each of the second lenses 234-1, 234-2, and 234-3 is disposed so as to cover each of the second openings 165*b*-1, 165*b*-2, and 165*b*-3. With respect to the X-Y plane, an area of each of the second lenses 234-1, 234-2, and 234-3 is larger than an area of each of the second openings 165*b*-1, 165*b*-2, and 165*b*-3.

Specifically, in the first sub pixel SP1, one first lens 232-1 may be disposed so as to cover one first opening 165*a*-1, and one second lens 234-1 may be disposed so as to cover one second opening 165*b*-1. In the second sub pixel SP2, two first lenses 232-2 may be disposed so as to cover each two first openings 165*a*-2, and one second lens 234-2 may be disposed so as to cover one second opening 165*b*-2. In the third sub pixel SP3, two first lenses 232-3 may be disposed so as to cover each two first openings 165*a*-3, and one second lens 234-3 may be disposed so as to cover one second opening 165*b*-3.

Accordingly, a plurality of first lenses 232-1, 232-2, and 232-3 corresponds to the first emission unit EA1 of each sub pixels SP1, SP2, and SP3. A plurality of second lenses 234-1, 234-2, and 234-3 corresponds to the second emission unit EA2 of each sub pixels SP1, SP2, and SP3.

As described above, the light emitting display device according to an exemplary embodiment of the present disclosure includes the half-spherical first lenses 232-1, 232-2, and 232-3 corresponding to the first anode electrodes 162-1, 162-2 and 162-3, and the half-cylindrical second lenses 234-1, 234-2, and 234-3 corresponding to the second anode electrodes 164-1, 164-2 and 164-3 to restrict the viewing angle. At this time, a viewing angle restriction direction of the first lenses 232-1, 232-2, and 232-3 and the second lenses 234-1, 234-2, and 234-3 is different from each other and two viewing modes (e.g., a wide viewing angle mode (also referred to as 'a share mode' or 'a first mode') and a narrow viewing angle mode (also referred to as 'a private mode' or 'a second mode')) may be implemented by selective driving.

Hereinafter, an operation of selectively implementing a first mode which is a wide field of view mode and a second mode which is a narrow field of view mode will be described in detail with reference to FIGS. 4 to 6.

Figure 4:
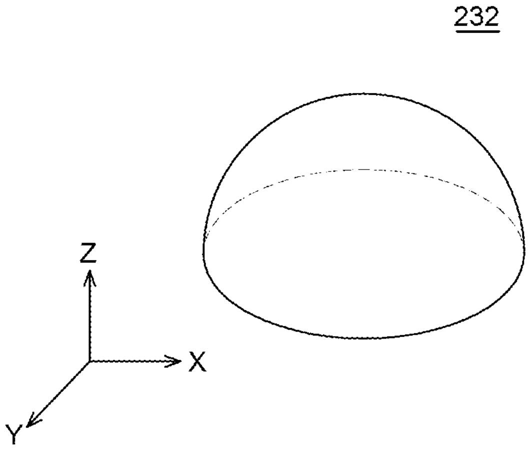
FIG. 4 is a view schematically illustrating a first lens of a light emitting display device according to an exemplary embodiment of the present disclosure.

First, FIG. 4 is a view schematically illustrating a first lens of a light emitting display device according to an exemplary embodiment of the present disclosure. FIG. 5 is a view schematically illustrating a second lens of a light emitting display device according to an exemplary embodiment of the present disclosure.

As illustrated in FIG. 4, the first lens 232 is a half-spherical lens and has a half-circular cross-section in the X-direction and the Y-direction. Accordingly, the first lens 232 restricts the viewing angle of the X-direction and the Y-direction. For example, the first emission unit EA including the half-spherical first lens 232 may have a narrow viewing angle which is 30 degrees or smaller in up, down, left, and right sides.

Figure 5:
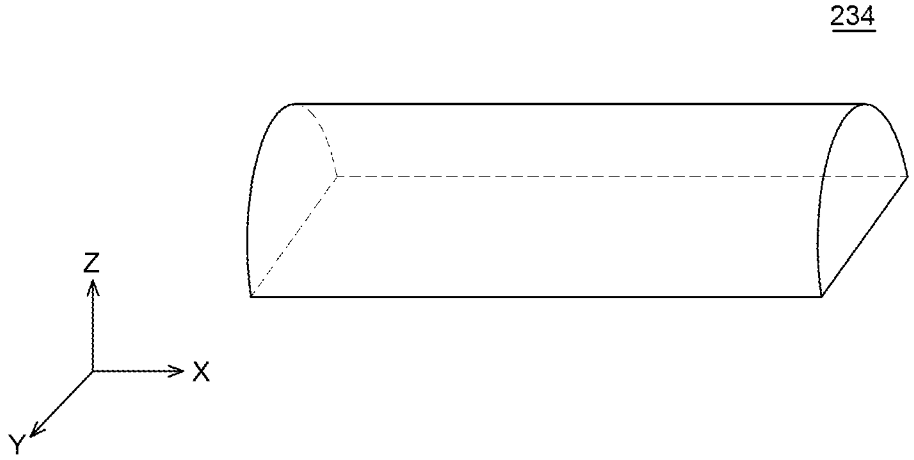
FIG. 5 is a view schematically illustrating a second lens of a light emitting display device according to an exemplary embodiment of the present disclosure.

In contrast, as illustrated in FIG. 5, the second lens 234 is a half-cylindrical lens and has a rectangle cross-section in the X-direction and a half-circular cross-section in the Y-direction. Accordingly, the second lens 234 restricts the viewing angle in the Y-direction and does not restrict the viewing angle of the length direction of the second lens 234, that is, the X-direction. For example, the second emission unit EA2 including the half-cylindrical second lens 234 may have a narrow viewing angle which is 30 degrees or smaller in the vertical direction and has a wide viewing angle which is 60 degrees or larger in the horizontal direction.

Accordingly, the vertical narrow field of view mode and the horizontal narrow field of view mode are implemented by driving the first emission unit EA1, and the vertical narrow field of view mode and the horizontal wide field of view mode may be implemented by driving the second emission unit EA2.

That is, the light emitting display device according to an exemplary embodiment of the present disclosure always has a narrow viewing angle in the vertical direction by the first lens 232 and the second lens 234, and may selectively implement the wide field of view mode and the narrow field of view mode in the horizontal direction.

The vertical wide field of view mode and narrow field of view mode will be described with reference to FIG. 6.

Figure 6:
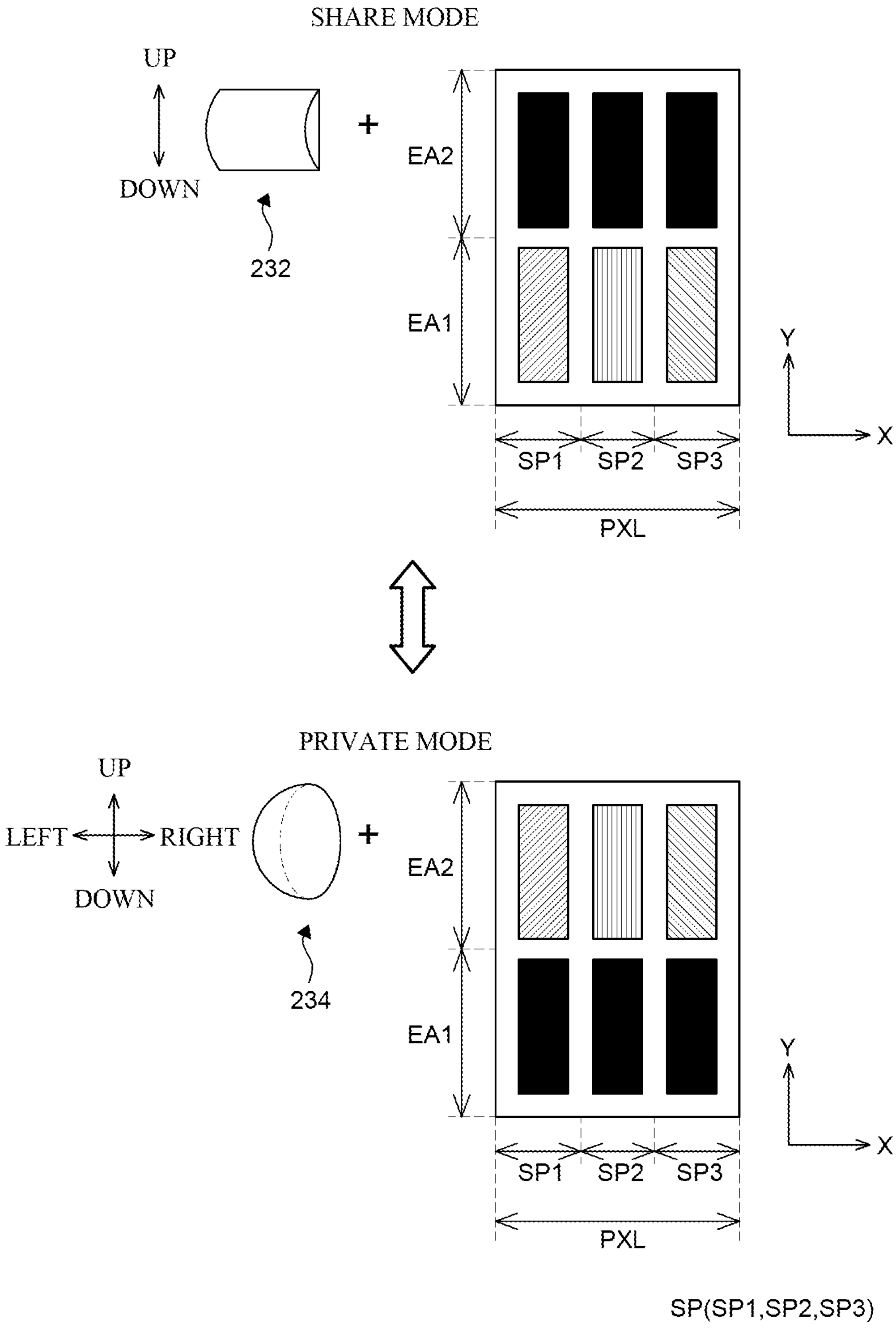
FIG. 6 is a view schematically illustrating an operation in a wide field of view mode and a narrow field of view mode of a light emitting display device according to an exemplary embodiment of the present disclosure.

FIG. 6 is a view schematically illustrating an operation in a wide field of view mode and a narrow field of view mode of a light emitting display device according to an exemplary embodiment of the present disclosure.

As illustrated in FIG. 6, one pixel PXL of a light emitting display device according to an exemplary embodiment of the present disclosure includes first to third sub pixels SP1, SP2, and SP3. Each of the first, second, and third sub pixels SP1, SP2, and SP3 has a first emission unit EA1 and a second emission unit EA2.

A half-spherical first lens 232 is provided so as to correspond to the first emission unit EA1, and a half-cylindrical second lens 234 is provided so as to correspond to the second emission unit EA2.

During the operation in the wide field of view mode, the first light emitting diode De1 of the first emission unit EA1 is in an off-state (see dark shades indicative of the light emitting diode being turned off) and the second light emitting diode De2 of the second emission unit EA2 is in an on-state. Light emitted from the second light emitting diode De2 is output with a restricted viewing angle in the Y direction, that is, in the vertical direction, by the second lens 234, and is output without limiting the viewing angle, in the X-direction, that is, in the horizontal direction. In other words, the viewing angle of the second lens 234 is different and in most cases larger than the viewing angle of the first lens 232.

In contrast, during the operation in the narrow field of view mode, the first light emitting diode De1 of the first emission unit EA1 is in an on-state and the second light emitting diode De2 of the second emission unit EA2 is in an off-state. Light emitted from the first light emitting diode De1 is output with a restricted viewing angle in the vertical direction and in the horizontal direction by the first lens 232.

As described above, the light emitting display device according to the exemplary embodiment of the present disclosure always has a narrow viewing angle in the vertical direction so that when it is applied to the vehicle, image may be suppressed from being reflected from the windshield so that the driver's view is obstructed.

Further, an image having a wide viewing angle in the horizontal direction is displayed in the wide field of view mode and an image having a narrow viewing angle in the horizontal direction is displayed in the narrow field of view mode. In this case, in the wide field of view mode, both users in the driver's seat and a front passenger's seat may watch the images and in the narrow field of view mode, one of the users in the driver's seat and a front passenger's seat may watch the image. For instance, according to one embodiment of the narrow field of view mode, the display device can display an image such that only one of the user sitting on either the driver seat or the passenger seat can view the image but not both at the same time. That is, in one embodiment, a degree of the viewing angle limited in the left direction can be different from a degree of the viewing angle limited in the right direction during the narrow field of view mode so that only one of the users sitting on either the driver seat or the passenger seat can view the image from the display device. For example, the viewing angle can be limited in the left direction (e.g., the direction of the driver seat) and not limited in the right direction (e.g., the direction of the passenger seat) such that only the user sitting on the passenger seat can view the image from the display device. Further, the wide field of view mode and the narrow field of view mode may be selectively implemented in the horizontal direction.

In the meantime, the first lens 232 and the second lens 234 are applied to increase a luminance as compared with the same area that does not have the lenses. Due to the light collection effect by the lenses, the light emitting display device of the present disclosure may lower the driving voltage compared to a display device that does not have the lenses. Accordingly, the first emission unit EA1 and the second emission unit EA2 may be driven with a lowered driving voltage to lower the power consumption, and reduce the luminance and heat generation, thereby increasing the lifespan of the plurality of light emitting diodes De1 and De2.

As described above, the first to third sub pixels SP1, SP2, and SP3 of the light emitting display device according to the exemplary embodiment of the present disclosure have different areas from each other. That is, openings which define the emission areas of the sub pixels SP1, SP2, and SP3 may have different areas from each other. The areas of the first to third sub pixels SP1, SP2, and SP3 may be determined in consideration of a lifespan and a luminous efficiency of the light emitting diode provided in each sub pixel. Specifically, a lifespan of the red light emitting diode is the longest. Accordingly, in order to make constant lifespan of the sub pixels, an area of the opening of the first sub pixel SP1 may be smaller than areas of the openings of each of the second sub pixel SP2 and the third sub pixel SP3.

In the meantime, referring to FIG. 2, the light emitting display device according to the exemplary embodiment of the present disclosure includes two light emitting diodes De1 and De2 in each of the sub pixels SP1, SP2, and SP3 to implement a wide field of view mode and a narrow field of view mode. Accordingly, the area of each of the light emitting diodes De1 and De2 may be significantly reduced more than an area of one light emitting diode provided in the light emitting display device of the related art. For example, in a general light emitting display device of the related art, as compared with the emission area of the red sub pixel, areas of the first light emitting diode De1 and the second light emitting diode De2 of the first sub pixel SP1 of the light emitting display device according to the exemplary embodiment of the present disclosure were reduced to 1/10 and 1/3 or less, respectively. As described above, as the area of each of the light emitting diodes De1 and De2 is significantly reduced, the capacitance of each of the light emitting diodes De1 and De2 is reduced.

A coupling degree of the anode electrode of each of the first emission unit and the second emission unit and the scan signal line is high, and when the scan signal rises, the voltage of the anode electrode of each of the first light emitting diode and the second light emitting diode is unnecessarily increased. To be more specific, at the end of the sampling period in which a threshold voltage of the driving transistor was sampled and the data voltage was programmed, all the scan signals rose so that a voltage difference between the anode electrode and the cathode electrode of each of the first light emitting diode and the second light emitting diode rose to a threshold voltage or more. Accordingly, there was a problem in that the luminance of each of the first light emitting diode and the second light emitting diode is unnecessarily increased.

In order to solve this technical problem, in the light emitting display device according to the exemplary embodiment of the present disclosure, the bank layer 165 of at least one of the first to third sub pixels SP1, SP2, and SP3 is formed to further include a third opening. The third opening additionally exposes at least one of the first anode electrode 162 and the second anode electrode 164.

Hereinafter, a structure of the bank layer in which the third opening is formed will be described in detail with reference to FIGS. 3 and 7 together.

Figure 7:
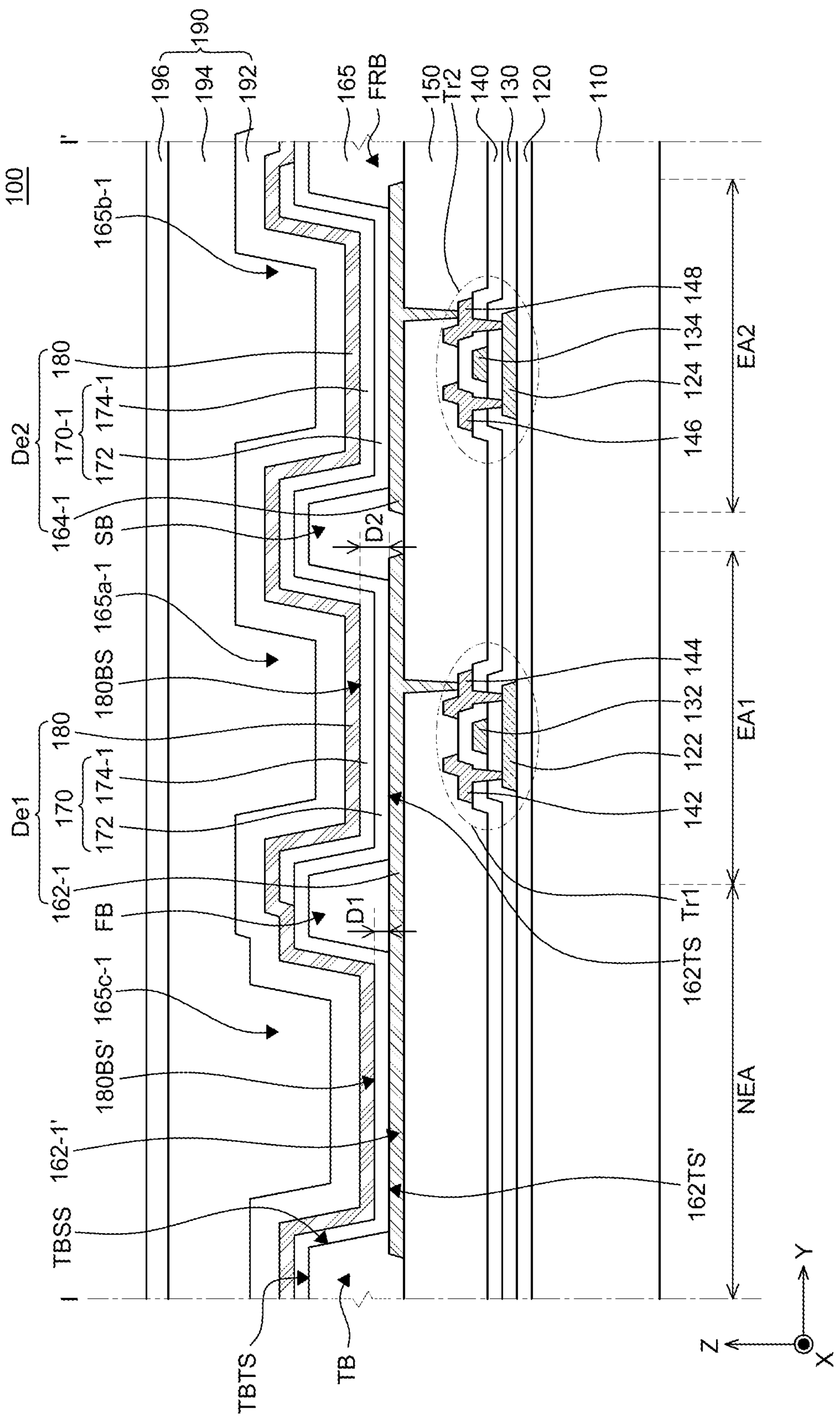
FIG. 7 is a schematic cross-sectional view taken along a line I-I' of FIG. 3.

FIG. 7 is a schematic cross-sectional view taken along the line I-I' of FIG. 3.

As described above, the first sub pixel SP1 includes a first emission unit EA1 and a second emission unit EA2. At this time, in the first emission unit EA1, a first light emitting diode De1 is provided and in the second emission unit EA2, a second light emitting diode De2 is provided.

In the first sub pixel SP1, a first thin film transistor Tr1 and the first anode electrode 162-1 are provided and in the second sub pixel SP2, a second thin film transistor Tr2 and a second anode electrode 164-1 are provided. In order to independently drive the first sub pixel SP1 and the second sub pixel SP2, the first anode electrode 162-1 and the second anode electrode 164-1 are independently disposed on the passivation layer 150 to be spaced apart from each other.

A bank layer 165 is formed on the first anode electrode 162-1 and the second anode electrode 164-1 as a common layer. The bank layer 165 overlaps edges of the first anode electrode 162-1 and the second anode electrode 164-1 and covers the edges of the first anode electrode 162-1 and the second anode electrode 164-1. At this time, the bank layer 165 has a first opening 165*a*-1 and a third opening 165*c*-1 which expose the first anode electrode 162-1 and a second opening 165*b*-1 which exposes the second anode electrode 164-1. Each of the first opening 165*a*-1 and the second opening 165*b*-1 define emission areas of the first light emitting diode De1 and the second light emitting diode De2. In contrast, the third opening 165*c*-1 is formed in a non-emission area NEA.

Referring to FIG. 7, the first opening 165*a*-1 exposes a first anode electrode 162-1 of the first light emitting diode De1 and the second opening 165*b*-1 exposes a top surface of a second anode electrode 164-1 of the second light emitting diode De2. In the first opening 165*a*-1 and the second opening 165*b*-1, an emission unit 170-1 including an organic material layer 172 and an emission layer 174-1 is disposed on the anode electrode 162-1 and a cathode electrode 180 is disposed on the emission unit 170-1. By doing this, the first light emitting diode De1 and the second light emitting diode De2 corresponding to the first opening 165*a*-1 and the second opening 165*b*-1 emit light.

Referring to FIG. 7, the third opening 165*c*-1 exposes the top surface of the first anode electrode 162-1, like the first opening 165*a*-1. However, in the third opening 165*c*-1, the organic material layer 172 is disposed on a top surface of the exposed first anode electrode 164-1 and the cathode electrode 180 is disposed on the organic material layer 172. That is, in the third opening 165*c*-1, the emission layer 174-1 is not disposed, unlike the first opening 165*a*-1 and the second opening 165*b*-1. Accordingly, when a voltage is applied to the first anode electrode 162-1 through the first thin film transistor Tr1, light is emitted from the first opening 165*a*-1 corresponding to the first light emitting diode De1. However, since there is no emission layer 174-1 in the third opening 165*c*-1, separate light is not emitted.

The third opening 165*c*-1 is formed in the non-emission area NEA. Referring to FIG. 3, the third opening 165*c*-1 may be formed in a position adjacent to the first opening 165*a*-1. In the meantime, unlike the light emitting display device of the related art, the first anode electrode 162-1 may further additionally extend so as to overlap the third opening 165*c*-1. Generally, unlike the anode electrode which is formed so as to correspond to the emission area, referring to FIG. 3, the first anode electrode 162-1 of the first sub pixel SP1 may further include an extension 162-1' which further protrudes in one direction, for example, in the Y-axis direction to secure a space for forming the third opening 165*c*-1. That is, the extension 162-1' is a part of the first anode electrode 162-1 and is continuous and contiguous with the first anode electrode 162-1. Further, as illustrated in FIG. 7, the extension 162-1' is disposed at the same time as the first anode electrode 162-1 and consists of the same material as the first anode electrode 162-1.

Even though in FIG. 3, it is illustrated that the third opening unit 165*c*-1 has a rectangular shape from a plan view, the third opening unit 165*c*-1 may have a polygonal shape other than a circle, an oval, or a quadrangular shape, but it is not limited thereto. As shown in FIG. 3, the third opening 165*c*-1 is located outside of the first subpixel SP1 and thus, located at a non-emission area NEA. The first subpixel SP1 has a trapezoid shape and the second subpixel SP2 has a trapezoid shape (reversed from in the plan view shown in FIG. 3) and the third opening 165*c*-1 is located between the first subpixel SP1 and the second subpixel SP2 but located both outside of the first subpixel SP1 and the second subpixel SP2.

In the third opening 165*c*-1, a distance D1 between the cathode electrode 180 and the first anode electrode 162-1 is reduced (compared to distance D2 between the cathode electrode 180 and the first anode electrode 162-1 in the first opening 165*a*-1) so that a capacitance of the first anode electrode 162-1 may be increased. In the third opening 165*c*-1, there is no emission layer 174-1 so that a capacitance between the first anode electrode 162-1 and the cathode electrode 180 is increased without increasing an area of the emission area. Accordingly, a capacitance which is reduced in the light emitting diodes De1 and De2 due to the reduced area of the light emitting diodes De1 and De2 may be compensated. By doing this, the luminance degradation problem which is caused by the reduced area of the light emitting diodes De1 and De2 may be solved.

Further referring to FIG. 7, the bank layer 165 includes a first opening 165*a*-1, a second opening 165*b*-1, and a third opening 165*c*-1. The openings in the bank layer 165 extends through the bank layer 165 and exposes a top surface of the anode electrode. For instance, the first opening 165*a*-1 extends through the bank layer 165 and exposes a top surface 162TS of the first anode electrode 162-1. Similarly, the third opening 165*c*-1 extends through the bank layer 165 and exposes a top surface 162TS' of the first anode electrode 162-1' (or the extended portion of the first anode electrode 162-1). Here, a first bank FB and a second bank SB are formed as a result of the first opening 165*a*-1. Similarly, a third bank TB and a first bank FB are formed as a result of the third opening 165*c*-1. The third bank TB is located adjacent to the first bank FB. However, the third bank TB is located at the non-emission area NEA.

In one embodiment, the cathode electrode 180 extends over the third opening 165*c*-1 and covers a side surface TBSS and a top surface TBTS of the third bank TB. As shown, the cathode electrode 180 is continuous and contiguously disposed from the non-emission area NEA to the first emission area EA1 and the second emission area EA2.

Although not shown, in one embodiment, the cathode electrode 180 may be disposed continuous and contiguously throughout the display panel.

The distance D1 between a top surface 162TS' of 162-1' and a bottom surface 180BS' of the cathode electrode 180 in the third opening 165*c*-1 is less than the distance D2 between a top surface 162TS of 162-1 and a bottom surface 180BS of the cathode electrode 180 in the first opening 165*a*-1.

As shown in FIG. 7, a top surface 162TS of the first anode electrode between the first bank FB and the second bank SB, and a top surface 162TS' of the first anode electrode between the first bank FB and the third bank TB are coplanar with each other.

Figure 9:
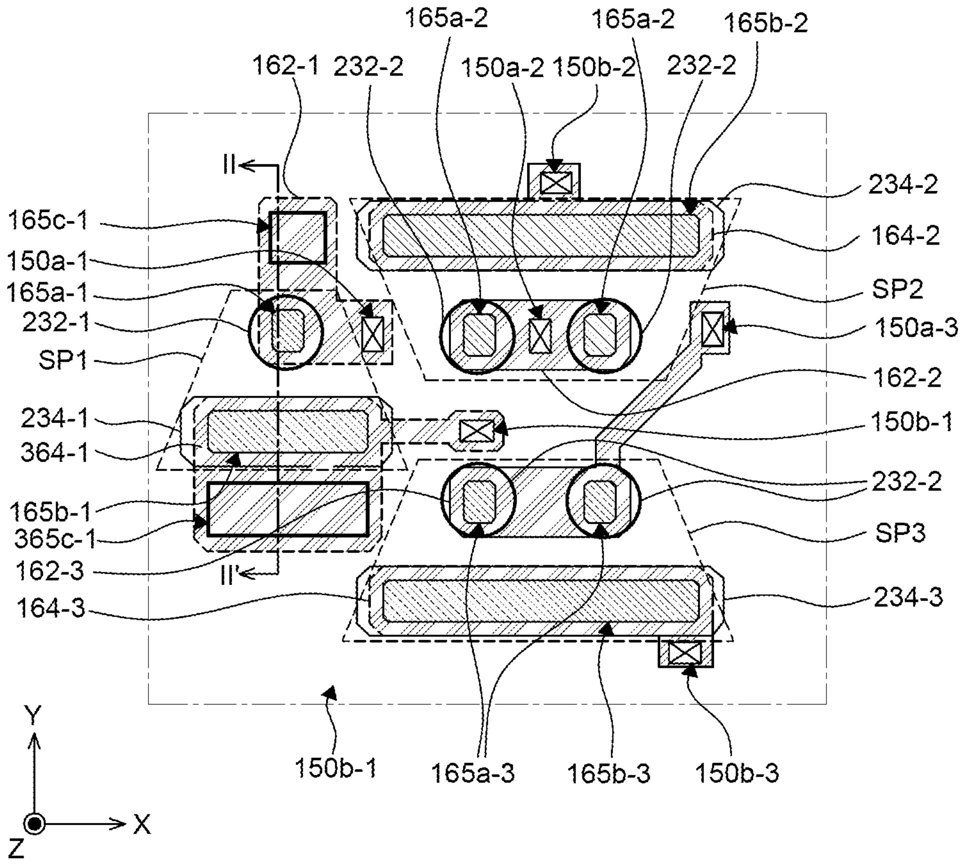
FIG. 9 is a plan view illustrating a pixel of a light emitting display device according to yet another exemplary embodiment of the present disclosure.

The second opening 165*b*-1 is between a second bank SB and a fourth bank FRB. The emission layer 174-1 may fully cover both side surfaces of the second bank SB and overlap the second opening 165*b*-1 and also cover a side surface of the fourth bank FRB and at least partially cover a top surface of the fourth bank FRB as shown in FIG. 7. Based on FIGS. 7 and 9, a display device according to one embodiment of the present disclosure may include a fourth opening 365*c*-1 defined by a space between a fourth bank FRB and a fifth bank. The fifth bank is not shown in FIG. 7, however, a cross-section of the fifth bank can be shown when taken a cross-section along lines II-II' of FIG. 9. Here, the fourth opening 365*c*-1 overlaps the non-emission area of the display device as shown in FIG. 9. The second anode electrode 164 extends to the non-emission area and overlaps the fifth bank. The first cathode electrode extends to the fourth opening and covers a top surface and side surface of the fifth bank. Here, a distance between a top surface of the second anode electrode and a bottom surface of the second cathode electrode between the fourth bank and the second bank is greater than a distance between a top surface of the first anode electrode and a bottom surface of the first cathode electrode between the fourth bank and the fifth bank.

According to one embodiment, the third bank TB and the first bank FB may be connected to each other and thus may not expose a top surface of the anode electrode (e.g., first anode electrode, second anode electrode) unlike the embodiments shown in FIG. 7

For example, as represented in Table 1, capacitances and black luminance of Comparative Example 1, Comparative Example 2, and Example Embodiment 1 are compared. In Comparative Example 1, one light emitting diode is provided in a red sub pixel in a general light emitting display device. In Comparative Example 2, in order to implement a wide field of view mode and a narrow field of view mode, one red sub pixel incudes a first light emitting diode and a second light emitting diode, but a separate third opening is not formed. In Example Embodiment 1, a third opening having the same area as the emission area of the first light emitting diode is formed in the light emitting display device according to the exemplary embodiment of the present disclosure. At this time, an area of the emission area of a light emitting diode of Comparative Example 1 and an area of a first light emitting diode of Comparative Example 2 and Example Embodiment 1 are represented in Table 1. (Operating condition, $V_{DD}$: 14 V, $V_{SS}$: 1 V, $V_{REF}$: 2.5 V, VGH: 15.5 V, VGL: −9 V, $V_{DATA}$: 0.2 V)

TABLE 1

| | Comp. Ex. 1 | Comp. Ex. 2 | Ex. Em. 1 |
|---|---|---|---|
| Area of emission area ($\mu m^2$) | 1135.7 | 79.5 | 79.5 |
| Capacitance (fF) | 287.33 | 31.13 | 61.00 |
| Luminance (nit) (@Black Data) | 0.000246 | 0.01166 | 0.00030 |

Referring to Comparative Examples 1 and 2, in the light emitting display device including a lens layer to control a viewing angle, an area of the emission area of the first light emitting diode for driving a narrow field of view mode is significantly reduced. As in Comparative example 2, if the area of the emission area is significantly reduced, it is confirmed that a capacitance between an anode and a cathode is significantly reduced so that the luminance value during the implementing of the black is significantly increased. Referring to Table 1, when the third opening having a similar area to that of the first opening is formed to be adjacent to the first opening which defines an emission area of the first light emitting diode like Example Embodiment 1, it is confirmed that the capacitance is increased so that the luminance value during the implementing of the black is significantly reduced. When Example Embodiment 1 and Comparative Example 2 were compared, it was confirmed that the luminance increase of the first light emitting diode of the red sub pixel is reduced by 97%. In FIG. 3, it is illustrated that the third opening 165*c*-1 is formed only in the first sub pixel SP1 to expose the first anode electrode 162-1, but it is not limited thereto. That is, depending on a type of the sub pixel and an emitted color, the third opening may also be formed in the second sub pixel or the third sub pixel, and may also be formed in two or more sub pixels among the first to third sub pixels.

However, as mentioned above, when it is considered that the lifespan of the red light emitting diode is generally longer than the lifespan of the blue light emitting diode and the green light emitting diode, areas of the first opening 165*a*-1 of the first light emitting diode De1 and the second opening 165*b*-1 of the second light emitting diode De2 which define the emission area in the first sub pixel SP1 which is the red sub pixel, are smaller than areas of the first openings 165*a*-2 and 165*a*-3 and the second openings 165*b*-2 and 165*b*-3 of the second sub pixel SP2 and the third sub pixel SP3. Accordingly, the third opening 165*c*-1 may be desirably formed in the first sub pixel SP1.

Further, as mentioned above, in order to implement the wide field of view mode and the narrow field of view mode, the light emitting display device according to the exemplary embodiment of the present disclosure includes a first lens 232-1 and a second lens 234-1. The first lens 232-1 corresponds to the first light emitting diode De1 and the second lens 234-1 corresponds to the second light emitting diode De2. At this time, the first lens 232-1 has a half-circular cross-section in the X-direction and the Y-direction to provide the narrow viewing angle in all the up, down, left, and right sides. By doing this, the emission area of the first light emitting diode De1 is smaller than that of the second light emitting diode De2 corresponding to the second lens 234-1 having a half-cylindrical shape. Accordingly, an area of the first opening 165*a*-1 of the first light emitting diode De1 may be smaller than an area of the second opening 165*b*-1 of the second light emitting diode De2 in one sub pixel. Accordingly, the lowering of the capacitance caused by the reduced emission area in the first light emitting diode De1 is further significant so that the first anode electrode 162-1 of the first light emitting diode De1 extends and the third opening 165*c*-1 may be desirably formed to expose the first anode electrode 162-1.

In order to selectively restrict the viewing angle, the light emitting display device according to the exemplary embodiment of the present disclosure includes the first light emitting diode and the second light emitting diode in one sub pixel and includes a first lens and a second lens. The first lens and the second lens correspond to the first light emitting diode and the second light emitting diode, respectively, and have different shapes. At this time, a plurality of light emitting diodes is provided in one sub pixel so that an area of the emission area of each light emitting diode is smaller than that of a general display device of the related art. As mentioned above, this configuration has the following technical benefit. That is, the capacitance of the light emitting diode with a reduced emission area is reduced so that when the diode is driven, a voltage of the anode electrode is unnecessarily increased so that the luminance is increased. Accordingly, the light emitting display device according to the exemplary embodiment of the present disclosure extends the anode electrode of the sub pixel with a reduced emission area and forms an additional opening in the bank layer to expose the anode electrode to increase the capacitance of the anode electrode. By doing this, the luminance degradation problem caused by the reduced area of the light emitting diode may be solved.

Figure 8:
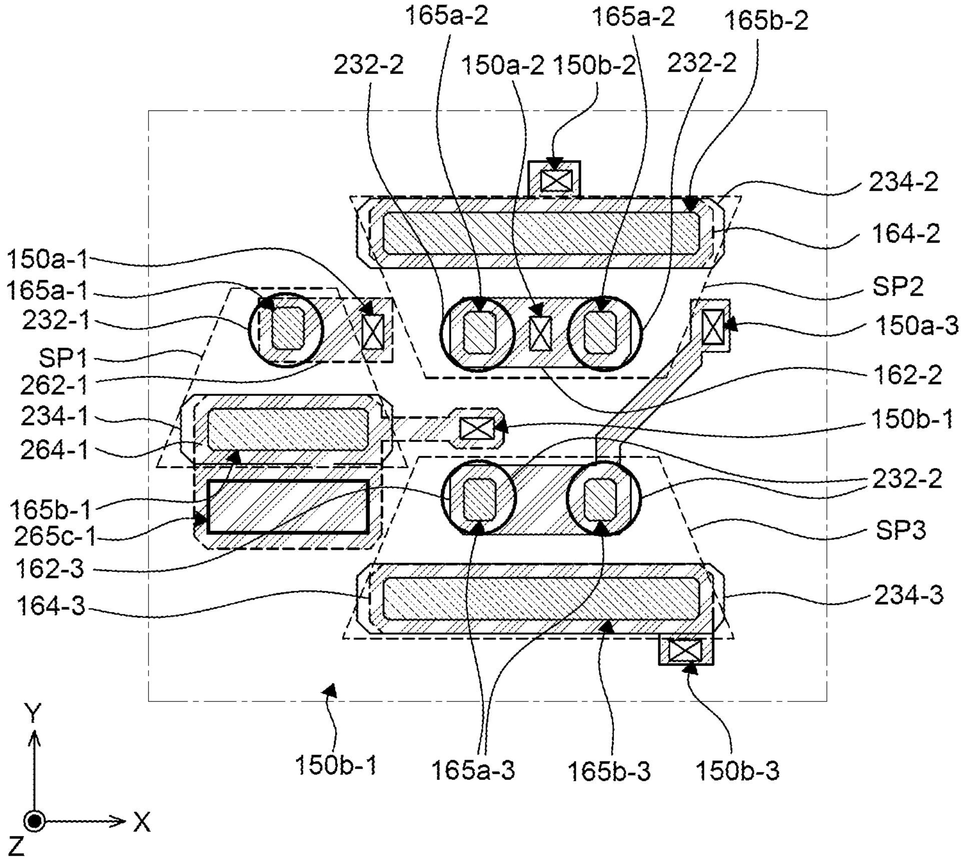
FIG. 8 is a plan view illustrating a pixel of a light emitting display device according to another exemplary embodiment of the present disclosure.

FIG. 8 is a plan view illustrating a pixel of a light emitting display device according to another exemplary embodiment of the present disclosure. A light emitting display device illustrated in FIG. 8 is substantially the same as the light emitting display device illustrated in FIG. 3 except for a position where the third opening is formed and a shape of the anode electrode. Therefore, a description of repeated components will be omitted.

Referring to FIG. 8, the first sub pixel SP1 includes a first opening 165*a*-1 and a second opening 165*b*-1. A third opening 265*c*-1 is located between the first sub pixel SP1 and the third sub pixel SP3 and is located outside of the first sub pixel SP1 and the third sub pixel SP3. The first opening 165*a*-1 exposes a first anode electrode 262-2 of the first light emitting diode De1 and the second opening 165*b*-1 and the third opening 265*c*-1 expose a top surface of a second anode electrode 264-1 of the second light emitting diode De3.

At this time, the third opening 265*c*-1 is formed in the non-emission area. In the light emitting display device illustrated in FIG. 3, the third opening 165*c*-1 exposes the first anode electrode 162-1, but in the pixel of the light emitting display device illustrated in FIG. 8, the third opening 265*c*-1 exposes the second anode electrode 264-1. Therefore, the third opening 265*c*-1 is formed in a position adjacent to the second opening 165*b*-1. Specifically, the third opening 265*c*-1 is disposed to be spaced apart from the second opening 165*b*-1 in the Y-axis direction centered on the second opening 165*b*-1. At this time, the second anode electrode 264-1 may further extend so as to overlap the third opening 265*c*-1. As illustrated in FIG. 8, the second anode electrode 264-1 may further include an extension which additionally protrudes in the Y-axis direction so as to secure a space in which the third opening 265*c*-1 is formed.

In the meantime, the area of the third opening 265*c*-1 of the light emitting display device illustrated in FIG. 8 may be larger than the area of the third opening 165*c*-1 of the light emitting display device illustrated in FIG. 3. In consideration of the emission area of the second light emitting diode De2 corresponding to the second lens 234-1 having a half-cylindrical shape, a size of the third opening 265*c*-1 may be similarly formed to a size of the second opening 165*b*-1.

FIG. 9 is a plan view illustrating a pixel of a light emitting display device according to another exemplary embodiment of the present disclosure. A light emitting display device illustrated in FIG. 9 is substantially the same as the light emitting display device illustrated in FIG. 9 except that a fourth opening 365*c*-1 is further provided and a shape of the second anode electrode 364-1 is changed. Therefore, a description of repeated components will be omitted.

Referring to FIG. 9, the first sub pixel SP1 includes a first opening 165*a*-1 and a second opening 165*b*-1. A third opening 165*c*-1 and a fourth opening 365*c*-1 are formed adjacent to the first sub pixel SP1. The first opening 165*a*-1 and the third opening 165*c*-1 expose the first anode electrode 162-1 of the first light emitting diode De1, and the second opening 165*b*-1 and the fourth opening 265*c*-1 expose the second anode electrode 364-1 of the second light emitting diode De2.

Unlike the light emitting display device illustrated in FIG. 3, in the pixel of the light emitting display device illustrated in FIG. 9, the fourth opening 365*c*-1 which exposes the second anode electrode 364-1 is also formed together with the third opening 165*c*-1 which exposes the first anode electrode 162-1 in the non-emission area. By doing this, the first anode electrode 162-1 may additionally protrude in the Y-axis direction so as to secure the space in which the third opening 165*c*-1 is formed, and the second electrode 364-1 may additionally protrude in the Y-axis direction so as to secure a space in which the fourth opening 365*c*-1 is formed.

In the light emitting display device illustrated in FIG. 9, both the first light emitting diode and the second light emitting diode which configure the first sub pixel having a smaller emission area than that of the second sub pixel and the third sub pixel additionally form an opening in the bank layer. Accordingly, the problem caused of the reduced area of the first light emitting diode and the second light emitting diode may be solved.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. All the technical concepts disclosed should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display device, comprising:

a display panel having a plurality of pixels, wherein each of the plurality of pixels includes a plurality of sub pixels, each of the plurality of sub pixels includes:

a first thin film transistor and a second thin film transistor;

a planarization layer on the first thin film transistor and the second thin film transistor;

a first light emitting diode on the planarization layer and includes a first anode electrode electrically connected to the first thin film transistor, a first emission unit, and a cathode electrode;

a second light emitting diode on the planarization layer and includes a second anode electrode electrically connected to the second thin film transistor, a second emission unit, and the cathode electrode;

a bank layer on the planarization layer and includes:

a first opening extending through the bank layer and exposing a top surface of the first anode electrode;

a second opening extending through the bank layer and exposing a top surface of the second anode electrode; and a third opening extending through the bank layer and exposing a top surface of the first anode electrode, in at least one of the plurality of sub pixels, an encapsulation layer on the first light emitting diode and the second light emitting diode; and a lens layer on the encapsulation layer and includes a first lens corresponding to the first light emitting diode and refracting light from the first light emitting diode and a second lens corresponding to the second light emitting diode and refracting light from the second light emitting diode.

2. The light emitting display device according to claim 1, wherein the third opening is disposed in a non-emission area adjacent to the first opening, and the first anode electrode extends to overlap the third opening.

3. The light emitting display device according to claim 1, wherein a first emission layer of the first emission unit is disposed in the first opening, a second emission layer of the second emission unit is disposed in the second opening, and the first emission layer and the second emission layer are not disposed in the third opening.

4. The light emitting display device according to claim 3, wherein the first emission layer and the second emission layer are continuously connected and integrally formed.

5. The light emitting display device according to claim 1, wherein the first emission unit includes a first organic material layer and a first emission layer, the second emission unit includes a second organic material layer and a second emission layer, and wherein in the third opening, the first anode electrode and the first organic material layer are in direct contact with each other, and the first organic material layer is disposed to be in direct contact with the cathode electrode.

6. The light emitting display device according to claim 1, wherein the bank layer further includes a fourth opening extending through the bank layer and exposing the second anode electrode, in at least one of the plurality of sub pixels.

7. The light emitting display device according to claim 6, wherein a first emission layer of the first emission unit is disposed in the first opening, a second emission layer of the second emission unit is disposed in the second opening, and both of the first emission layer and the second emission layer are not disposed in the third opening and the fourth opening.

8. The light emitting display device according to claim 1, wherein a narrow field of view mode and a wide field of view mode are selectively driven, in the narrow field of view mode, the first light emitting diode emits light so that light from the first light emitting diode is output with a limited viewing angle with respect to a first direction and a second direction by the first lens, and in the wide field of view mode, the second light emitting diode emits light so that light from the second light emitting diode is output with a limited viewing angle only with respect to a first direction.

9. A display device, comprising:

a substrate having thereon an emission area and a non-emission area;

a first light emitting diode on the substrate, the first light emitting diode overlapping with the emission area and including:

a first anode electrode;

a first cathode electrode; and a light emitting organic material layer between the first anode electrode and the first cathode electrode;

a first lens disposed above the first light emitting diode;

a bank layer on the substrate, the bank layer having a first opening that extends through the bank layer and is aligned with a top surface of the first anode electrode;

a first bank and a second bank of the bank layer being adjacent to the first opening; and a third bank adjacent to the first bank, the third bank located in the non-emission area, wherein a second opening is between the first bank and the third bank.

10. The display device of claim 9, wherein the first anode electrode extends to the third bank in the non-emission area, and wherein the second opening exposes a top surface of the first anode electrode between the first bank and the third bank.

11. The display device of claim 9, wherein a distance between a top surface of the first anode electrode and a bottom surface of the first cathode electrode between the first bank and the second bank is greater than a distance between a top surface of the first anode electrode and a bottom surface of the first cathode electrode between the first bank and the third bank.

12. The display device of claim 9, further comprising:

a second light emitting diode on the substrate and adjacent to the first light emitting diode, the second light emitting diode including:

a second anode electrode;

the first cathode electrode; and the light emitting organic material layer between the second anode electrode and the first cathode electrode;

a second lens disposed above the second light emitting diode;

wherein the second bank is disposed between the first light emitting diode and the second light emitting diode, and wherein the first anode electrode and the second anode electrode are spaced apart from each other at the second bank.

13. The display device of claim 12, wherein the first lens includes a lens having a half spherical shape, and wherein the second lens includes a lens having a half cylindrical shape.

14. The display device of claim 13, wherein a display mode includes a narrow field of view mode and a wide field of view mode, wherein, in operation, the narrow field of view mode and the wide field of view mode are selectively operated by using the first lens and the second lens, respectively.

15. A display device, comprising:

a substrate having thereon a first subpixel, a second subpixel, and a third subpixel thereon, each of a different color, the first subpixel having an area smaller than that of the second and third subpixels;

wherein each of the first, second, and third subpixels include:

a first light emitting diode;

a first lens disposed over the first light emitting diode;

a second light emitting diode adjacent to the first light emitting diode; and a second lens disposed over the second light emitting diode;

wherein, in operation, the display device selectively operates between a wide field of view mode and a narrow field of view mode, wherein the narrow field of view mode is implemented based on the first lens, wherein the wide field of view mode is implemented based on the second lens.

16. The display device of claim 15, wherein the first subpixel is a red colored subpixel, the second subpixel is a green colored subpixel, and the third subpixel is a blue colored subpixel.

17. The display device of claim 15, wherein the first subpixel includes:

a first bank and a second bank, the second bank between the first light emitting diode and the second light emitting diode; and a first opening formed in a space between the first bank and the second bank, the first opening overlapping the first lens;

a second opening defined by a space between a third bank and the first bank, the second opening overlapping a non-emission area of the display device, wherein the first light emitting diode includes:

a first anode electrode;

a cathode electrode;

an organic material layer between the first anode electrode and the cathode electrode; and an emission layer between the first anode electrode and the cathode electrode;

wherein the emission layer covers a side surface and at least a portion of a top surface of the first bank, and wherein the first anode electrode extends to the non-emission area and overlaps the third bank.

18. The display device of claim 17, further comprising:

a fourth bank adjacent to the second bank; and a third opening formed in a space between the second bank and the fourth bank, the third opening overlapping the second lens and the second light emitting diode, wherein the emission layer extends over the second bank and the third opening, wherein the emission layer covers a side surface and at least a portion of a top surface of the fourth bank, and wherein the second light emitting diode includes:

a second anode electrode;

the cathode electrode;

the organic material layer between the second anode electrode and the cathode electrode; and the emission layer between the second anode electrode and the cathode electrode;

wherein the first anode electrode and the second anode electrode are spaced apart from each other at the second bank.

19. The display device of claim 18, further comprising:

a fourth opening defined by a space between a fourth bank and a fifth bank, the fourth opening overlapping the non-emission area of the display device;

the second anode electrode extends to the non-emission area and overlaps the fifth bank, wherein the cathode electrode extends to the fourth opening and covers a top surface and side surface of the fifth bank.

20. The display device of claim 19, wherein a distance between a top surface of the second anode electrode and a bottom surface of the cathode electrode between the fourth bank and the second bank is greater than a distance between a top surface of the first anode electrode and a bottom surface of the cathode electrode between the fourth bank and the fifth bank.

* * * * *